US00RE46067E

(19) United States
(12) Reissued Patent
Siebke

(10) Patent Number: US RE46,067 E
(45) Date of Reissued Patent: Jul. 12, 2016

(54) THERMAL PROTECTION FOR DISC BRAKE COMPONENTS

(71) Applicant: Bendix Spicer Foundation Brake LLC, Elyria, OH (US)

(72) Inventor: Alf Siebke, Schondorf am Ammersee (DE)

(73) Assignee: Bendix Spicer Foundation Brake LLC, Elyria, OH (US)

(21) Appl. No.: 14/185,076

(22) Filed: Feb. 20, 2014

Related U.S. Patent Documents

Reissue of:
(64) Patent No.: 8,387,761
Issued: Mar. 5, 2013
Appl. No.: 12/731,473
Filed: Mar. 25, 2010

(51) Int. Cl.
*F16D 65/78* (2006.01)
*H03F 3/60* (2006.01)
*F16D 65/18* (2006.01)
*F16D 125/70* (2012.01)

(52) U.S. Cl.
CPC ..... *H03F 3/608* (2013.01); *F16D 65/18* (2013.01); *F16D 2125/70* (2013.01)

(58) Field of Classification Search
CPC ..... F16D 65/18
USPC ..... 188/264 G, 71.6; 277/636, 597, 633; 428/34.7
See application file for complete search history.

(56) References Cited

U.S. PATENT DOCUMENTS 3,592,303 A * 7/1971 Tincher ..... 188/284
4,431,090 A 2/1984 Kinoshita
4,506,768 A * 3/1985 Innocent ..... 188/370
4,512,446 A 4/1985 Chuwman et al.
4,527,672 A * 7/1985 Schreiner et al. ..... 188/264 G
4,537,289 A * 8/1985 VonGrunberg et al. ..... 188/72.4
4,583,623 A 4/1986 Ritsema
4,662,484 A 5/1987 Adachi et al.
5,090,520 A 2/1992 Gockel et al.

(Continued)

FOREIGN PATENT DOCUMENTS

CN 1382250 A 11/2002
CN 1415057 A 4/2003

(Continued)

OTHER PUBLICATIONS

International Search Report dated May 20, 2011 (Two (2) pages).

(Continued)

*Primary Examiner* — Matthew C Graham
(74) *Attorney, Agent, or Firm* — Crowell & Moring LLP

(57) ABSTRACT

A disc brake for a motor vehicle is provided. The disc brake includes a brake disc, a brake caliper configured to straddle the brake disc, a tappet carried by the brake caliper and arranged to push a brake pad against the brake disc, and a bellows provided between the brake caliper and the tappet to seal a gap between the brake caliper and the tappet. A layer of flexible thermal insulation material may be provided between the bellows and the tappet. The layer of flexible thermal insulation material is configured to protect an outer surface of the bellows facing the brake pad from exposure to heat. Alternatively, the bellows may include a layer of flexible thermal insulation material on which an elastomer layer is formed. The layer of flexible thermal insulation material is configured to face the brake pad.

19 Claims, 9 Drawing Sheets

(56) References Cited

U.S. PATENT DOCUMENTS

| | | | | |
|---|---|---|---|---|
| 5,145,191 | A * | 9/1992 | Stewart et al. | 277/636 |
| 5,568,845 | A * | 10/1996 | Baumgartner et al. | 188/71.9 |
| 5,660,253 | A | 8/1997 | Rike | |
| 5,660,899 | A * | 8/1997 | Rockney et al. | 428/34.7 |
| 6,722,477 | B1 | 4/2004 | Wolfsteiner et al. | |
| 6,766,885 | B2 | 7/2004 | Severinsson et al. | |
| 6,818,314 | B1 * | 11/2004 | Wilson | 428/472 |
| 6,923,297 | B1 * | 8/2005 | Thomas et al. | 188/72.8 |
| 7,267,207 | B2 | 9/2007 | Fischer et al. | 188/73.1 |
| 7,367,433 | B2 | 5/2008 | Bieker et al. | |
| 7,905,336 | B2 | 3/2011 | Cortinovis | |
| 2001/0047913 | A1 | 12/2001 | Conti et al. | |
| 2006/0137943 | A1 | 6/2006 | Mayrhofer et al. | |
| 2006/0175155 | A1 | 8/2006 | Gasslbauer et al. | |
| 2008/0217118 | A1 | 9/2008 | Cao et al. | |
| 2009/0236189 | A1 | 9/2009 | Macke | |

FOREIGN PATENT DOCUMENTS

| | | | |
|---|---|---|---|
| CN | 1422366 | A | 6/2003 |
| CN | 101512180 | A | 8/2009 |
| EP | 1 972 821 | B1 | 9/2008 |
| EP | 1 972 821 | B1 | 10/2009 |

OTHER PUBLICATIONS

PCT/ISA/237 (Four (4) pages).

Chinese Office Action dated Jul. 30, 2014, including English translation (nineteen (19) pages).

International Search Report dated May 20, 2011 (Three (3) pages), PCT/ISA/237 (Four (4) pages).

* cited by examiner

THERMAL PROTECTION FOR DISC BRAKE COMPONENTS

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

BACKGROUND OF THE INVENTION

The present invention relates to thermal protection of disc brake components.

The application of a brake pad against a rotating brake disc results in the generation of very high temperatures. Although a large portion of the heat generated by the friction between the brake pad and the brake disc is dissipated by heat transfer directly from the brake disc to the air, a significant amount of heat passes from the brake pad into the structure of the brake caliper. In particular, undesirably high amounts of heat may be transferred to heat-sensitive components within the brake caliper.

As shown in FIG. 1, a typical disc brake 100 uses at least one moveable piston or tappet 110 to exert a braking force on a brake disc 120 via a brake pad 130. The disc brake 100 may include two brake pads 130 opposed to each other on either side of the brake disc 120 (not shown). The brake caliper 140 straddles the brake disc 120, with the brake pad 130 located between the tappet 110 and the brake disc 120. When the brake pad 130 is in a new condition, the tappet 110 is in a fully retracted position at a maximum distance from the brake disc 120, as shown in FIG. 1. In order to push the brake pad 130 against the brake disc 120, the tappet 110 moves toward the brake disc 120. As the brake pad 130 is used, the friction between the brake pad 130 and the brake disc 120 causes the friction material of the brake pad 130 and the brake disc 120 to wear down. As the thickness of the brake pad 130 decreases, the tappet 110 moves closer to the brake disc 120 to maintain a desired maximum clearance between the brake pad 130 and the brake disc 120 in order to minimize brake free-play. Eventually the tappet 110 reaches a fully extended position when the brake pad 130 and the brake disc 120 are in a maximum wear condition, as shown in FIG. 2.

In order to ensure the performance of the disc brake 100 over its service life, the internal caliper components must be protected from environmental influences, such as dust, chemicals, gases, and water. Typically a bellows 150 is provided to seal the annular gap between the brake caliper 140 and the tappet 110, and to prevent dust, chemicals, gases, and water from entering the internal mechanism of the brake. The bellows 150 has a first surface 151 that is affixed to the caliper 140, and a second surface 152 that is affixed to the tappet 110. The first surface 151 of the bellows 150 may be directly connected to the caliper 140 or to a component outside of the caliper 140, such as a cover plate bolted to the caliber 140 (not shown). The bellows 150 extends and retracts with the tappet 110 as the tappet 110 advances toward the brake disc 120 and returns to its rest position. In this way the bellows 150 maintains the seal between the brake caliper 140 and the tappet 110 during all operational conditions.

The bellows 150, which is typically made of silicon rubber, is particularly sensitive to high temperatures. Contact between the bellows 150 and the portion of the tappet 110 immediately adjacent to the brake pad 130 (i.e. the portion of the tappet 110 reaching the highest temperatures during brake application) must be avoided, because this portion of the tappet 110 may reach temperatures that can melt or damage the rubber bellows 150. Such contact is particularly likely when the tappet 110 is in or near the fully retracted position as shown in FIG. 1, when the bulk of the retracted the bellows 150 is gathered near the tappet 110. Further, the folds of the bellows 150 do not collapse uniformly during retraction. Instead, the folds collapse stepwise, and single folds can resist the collapsing movement by remaining in an inclined position for an extended period of time. This increases the risk of contact between local areas of the bellows 150 and the tappet 110 as the tappet 110 moves away from the brake disc 120.

The bellows 150 is also vulnerable to convective heat transfer from the braking process. For example, when the tappet 110 is in the fully extended position as shown in FIG. 2, the bellows 150 is completely unfolded, such that its full wall length is exposed to environmental attack and heat from the braking process. Further, the bellows 150 typically sees higher temperatures when the tappet 100 is fully extended (i.e. when the brake pad 130 and the brake disc 120 are in the maximum wear condition), as compared to when the brake pad 130 and the brake disc 120 are new. This is due to the reduced heat capacity of the brake disc 120 and the brake pad 130 caused by their reduced thicknesses as well as the reduced thermal insulation effect of the thinner, worn out brake pad 130. Therefore, the bellows 150 is particularly vulnerable to thermal degradation when the tappet 110 is in the fully extended position.

Previous disc brake designs have included mechanisms for protecting the bellows from heat generated during the braking process. For example, the rubber bellows may be enclosed with a metallic spiral spring enclosure. However, because the metal has a high heat conductivity, the metal may melt or damage the rubber bellows upon contact. Further, it is difficult to prevent contact between the metallic enclosure and the bellows, due to the small packaging space and the uncontrollable deformation of the bellows and the metallic spring. In addition, the metallic enclosure has a poor strength of shape, especially along the lateral direction and in the fully expanded position. This can cause individual coils to skip or jam, which adversely affects the protection function of the metallic enclosure. It can also compromise the full release of the brake and cause a running clearance reduction with the risk of a hot running brake. Further, in this state it is not possible to completely retract the tappet from the brake disc to change the brake pad, due to the increased block height of the spiral spring.

U.S. Pat. No. 7,267,207 discloses a disc brake in which the rubber bellows are replaced with metallic bellows. However, this requires a high cost for caliper design changes, because metallic bellows are made of very thin-walled and high-grade stainless steel, and the metallic bellows are costly. In addition, relatively high forces are needed to deform the metallic bellows during extension and retraction of the tappet.

U.S. Publication No. 2001/0047913 discloses a disc brake that includes a pressure plate and a heat shield on the back plate of the brake pad. However, this provides limited protection against convective heat transfer, because the sides of the bellows are still exposed. Also, additional space is needed for the pressure plate and heat shield, and there is a significant additional cost to provide the pressure plate and heat shield, and their connection to the tappet.

U.S. Publication No. 2006/0175155 discloses a disc brake that includes an insulation disc on the tappet. The insulation disc is only effective against conductive heat transfer, and does not prevent contact between the bellows and the tappet.

Also, depending on its elasticity, the insulation disc may increase the stroke demand of the brake.

In addition, other disc brake designs have included a heat shield that partially covers the bellows. For example, U.S. Pat. No. 4,431,090 discloses a rubber ring that deforms when impacted by the piston, U.S. Pat. No. 3,592,303 discloses an elastic heat shield that expands circumferentially as the plunger extends, and European Patent No. EP 1 972 821 B1 discloses a metallic heat shield that is inserted into an end of the bellows. However, none of these disc brake designs provides a heat shield that protects the entire exposed surface of the bellows throughout the operation of the disc brake.

Accordingly, there is a need for an improved disc brake in which the bellows 150 is protected against excessive heat generated during the braking process. In particular, the apparatus should advantageously protect the bellows 150 from heat throughout the entire operating range of the tappet 110.

SUMMARY OF THE INVENTION

The present invention addresses the foregoing problems by the novel arrangement of thermal barriers between the bellows and the tappet. In a first embodiment of the present invention, a layer of flexible thermal insulation material is provided between the bellows and the tappet. The layer of flexible thermal insulation material is configured to protect an outer surface of the bellows facing the brake pad from exposure to heat. *The bellows is configured to seal the air gap when the tappet is in the fully retracted position, the fully extended position, and any intermediate position.*

The layer of flexible thermal insulation material may include a first fixed end and a second fixed end. A section between the first fixed end and the second fixed end may be configured to maintain the protection of the outer surface of the bellows as the tappet moves toward the brake disc. The section may be configured to unfold or unroll as the tappet moves toward the brake disc.

The flexible thermal insulation material may be a woven or knitted material. The woven or knitted material may include silica yarns, a combination of silica and fiberglass yarns, or basalt yarns*, which are non-metallic*.

The first fixed end of the layer of flexible thermal insulation material may be attached to the tappet, and the second fixed end of the layer of flexible thermal insulation material may be attached to the brake caliper. Alternatively, the first fixed end of the layer of flexible thermal insulation material may be attached to an inner circumference of the bellows, and the second fixed end of the layer of flexible thermal insulation material may be attached to an outer circumference of the bellows.

The section of the layer of flexible thermal insulation material between the first fixed end and the second fixed end may include a first segment adjacent to the first fixed end, wherein the first segment is provided between the bellows and the tappet in a direction of brake pad application when the tappet is in a retracted state. The section may also include a second segment adjacent to the second fixed end, wherein the second segment is provided in a space outside of an outer circumference of the bellows when the tappet is in the retracted state.

The disc brake with the layer of flexible thermal insulation material may be incorporated into an axle for a motor vehicle. The disc brake with the layer of flexible thermal insulation material may also be incorporated into a motor vehicle.

According to another embodiment of the present invention, the bellows includes a first layer of flexible thermal insulation material and a first elastomer layer formed on a first surface of the first layer of flexible thermal insulation material. A second surface of the first layer of flexible thermal insulation material opposing the first surface faces the brake pad.

The flexible thermal insulation material may be a woven or knitted material. The woven or knitted material may include silica yarns, a combination of silica and fiberglass yarns, or basalt yarns. The elastomer layer may include silicon rubber.

The bellows may also include a second layer of flexible thermal insulation material and a second elastomer layer formed on a first surface of the second layer of flexible thermal insulation material. The first elastomer layer and the second elastomer layer may be separated by an air gap. Alternatively, the first elastomer layer and the second elastomer layer may be joined by a plurality of additional elastomer layers to form a series of stacked discs.

The disc brake with the bellows may be incorporated into an axle for a motor vehicle. The disc brake with the bellows may also be incorporated into a motor vehicle.

Other objects, advantages, and novel features of the present invention will become apparent from the following detailed description of the invention when considered in conjunction with the accompanying drawings.

DETAILED DESCRIPTION

Figure 1:
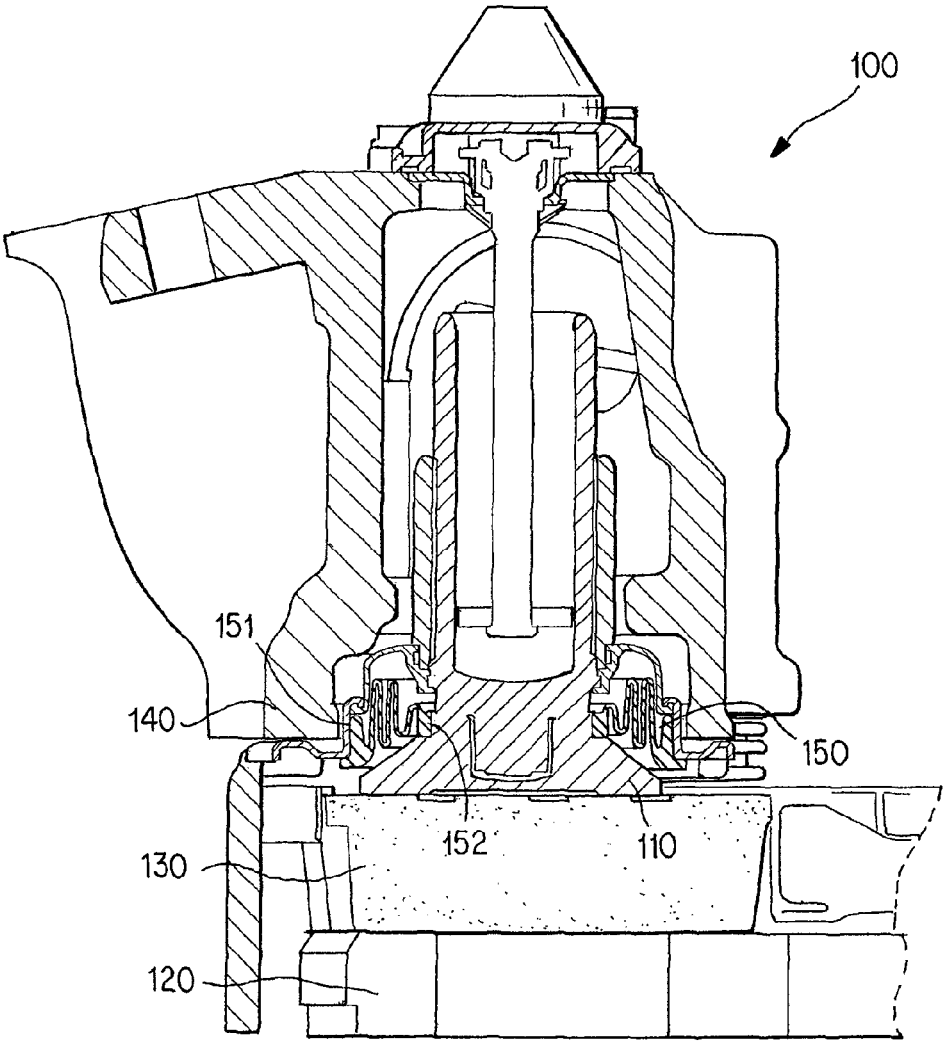
FIG. 1 RELATED ART
FIG. 1 shows a partial sectional view of a typical disc brake when the brake pad is in a new condition.
Figure 3:
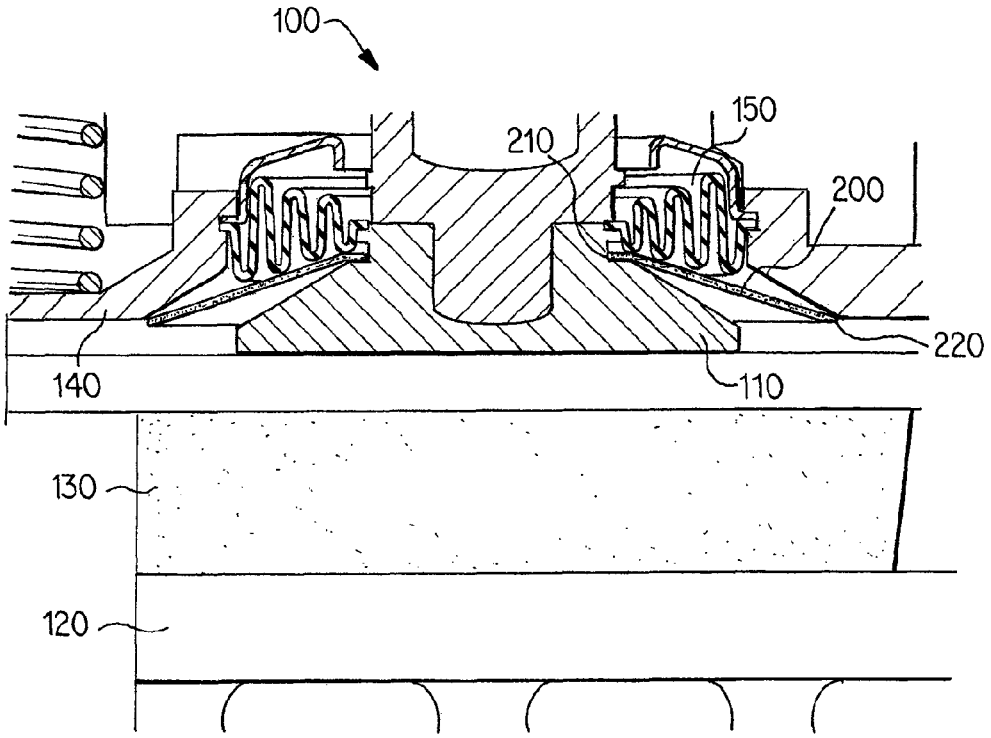
FIG. 3 shows a partial sectional view of a disc brake with an insulation disc between the tappet and the bellows, according to an exemplary embodiment of the present invention.

FIG. 3 shows a partial sectional view of a disc brake 100 with an insulation disc 200 between the tappet 110 and the bellows 150, according to an exemplary embodiment of the present invention. Similar to FIG. 1, the tappet 110 shown in FIG. 3 is in a fully retracted position. The insulation disc 200 is inserted into an existing air gap between the tappet 110 and the bellows 150 to prevent the bellows 150 from contacting the tappet 110. The insulation disc 200 has an annular shape. A first end 210 of the insulation disc 200 may be a circular inner circumference that is attached to the tappet 110. A second end 220 of the insulation disc 200 may be a circular outer circumference that extends beyond the outer circumference of the bellows 150. The insulation disc 200 may rest on the tappet 110 and move downward with the tappet 110 to prevent the bellows 150 from contacting the tappet 110. The second end 220 of the insulation disc 200 is not attached to the caliper 140.

The insulation disc 200 is a flexible thermal insulation material, which may be a woven or knitted material. For example, the flexible thermal insulation material may be made of silica yarns, a combination of silica and fiberglass yarns, or basalt yarns. Other materials may be chosen to optimize temperature resistance and disc brake design, and to minimize cost.

Because the folds of the bellows 150 rest against the insulation disc 200, preventing the bellows 150 from contacting the tappet 110, the bellows configuration is no longer constrained by the need to shape the bellows 150 in a manner that prevents contact with the tappet 110. The insulation disc 200 therefore permits more free deformation of the bellows 150, allowing the length and/or diameter of the bellows 150 to be optimized to improve the functionality and service life of the bellows 150. Further, the increased design freedom permits the space needed to install the bellows 150 to be decreased by compressing the bellows 150 in a defined manner when the tappet 110 is fully retracted without risking thermal overload of the bellows 150. For example, the compression may be made to occur between the insulation disc 200 and the rear wall of the space for the bellows 150.

Figure 4:
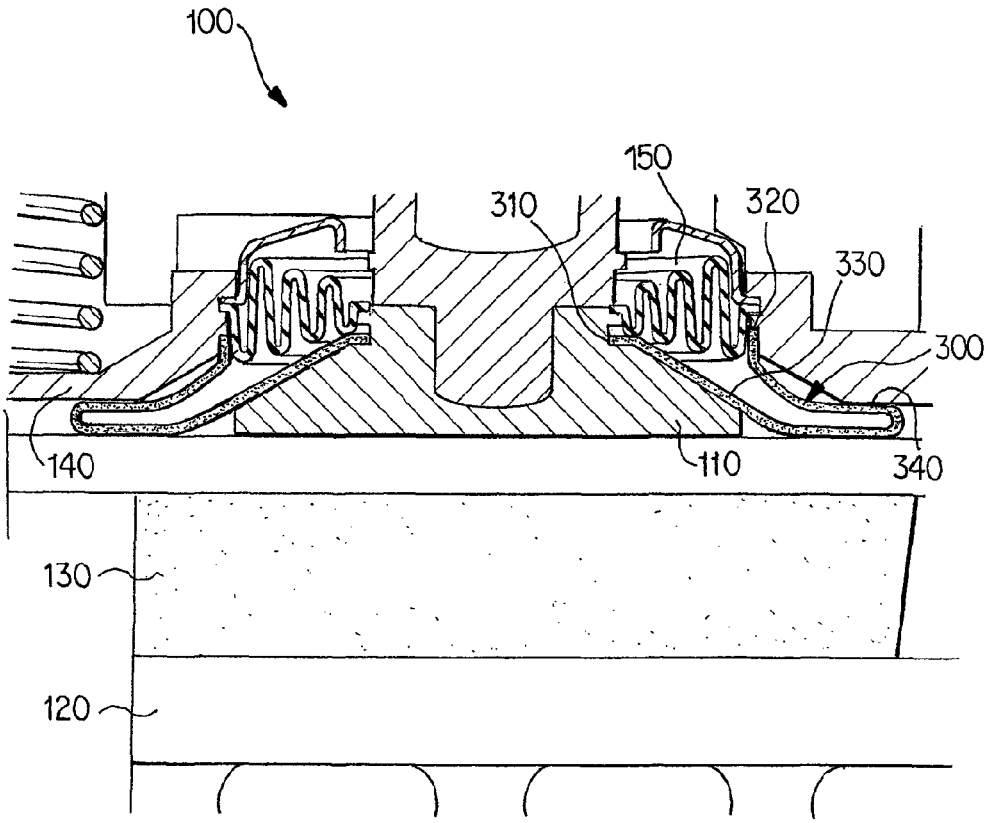
FIG. 4 shows a partial sectional view of a disc brake with a folded insulation layer between the tappet and the bellows, according to an exemplary embodiment of the present invention.

FIG. 4 shows a partial sectional view of a disc brake 100 with a folded insulation layer 300 between the tappet 110 and the bellows 150, according to another exemplary embodiment of the present invention. Similar to FIG. 1, the tappet 110 shown in FIG. 4 is in a fully retracted position. The folded insulation layer 300 is a flexible thermal insulation material, which may be a woven or knitted material. For example, the flexible thermal insulation material may be made of silica yarns, a combination of silica and fiberglass yarns, or basalt yarns. Other materials may be chosen to optimize temperature resistance and disc brake design, and to minimize cost. For example, the folded insulation layer 300 may be cut out of a flat woven or knitted half-finished cloth, or cut off of a knitted hose.

As shown in FIG. 4, the folded insulation layer 300 has a first fixed end 310 and a second fixed end 320. The first fixed end 310 may be attached to the tappet 110 and the second fixed end 320 may be attached to the caliper 140. Alternatively, the first fixed end 310 and the second fixed end 320 may be attached to the bellows 150. Specifically, the first fixed end 310 may be attached to the inner circumference of the bellows 150, and the second fixed end 320 may be attached to the outer circumference of the bellows 150. Some or all of the attachments may be made by clamping.

An inner portion 330 of the folded insulation layer 300 is adjacent to the first fixed end 310 of the folded insulation layer 300. The inner portion 330 of the folded insulation layer 300 is provided between the tappet 110 and the bellows 150 in a direction of application of the brake pad 130 when the tappet 110 is in the fully retracted state. Accordingly, the inner portion 330 of the folded insulation layer 300 prevents the bellows 150 from contacting the tappet 110 when the tappet 110 is in the fully retracted state.

An outer portion 340 of the folded insulation layer 330 is adjacent to the second fixed end 320 of the folded insulation layer 300. As shown in FIG. 4, the outer portion 340 of the folded insulation layer 300 may be folded within a space outside of an outer circumference of the bellows 150 when the tappet 110 is in the fully retracted state. Alternatively, the outer portion 340 of the folded insulation layer 300 may be rolled within a space outside of an outer circumference of the bellows 150 when the tappet 110 is in the fully retracted state.

When the tappet 110 extends toward the brake disc 120, the bellows 150 expands to maintain the seal between the brake caliper 140 and the tappet 110. For example, the outer circumference of the bellows 150 is fixed to the brake caliper 140, and remains in place when the tappet 110 extends toward the brake disc 120. The inner circumference of the bellows 150 may be fixed to the tappet 110, and move toward the brake disc 120 with the tappet 110. Accordingly, the bellows 150 unfolds in a downward direction.

In order to protect the entire surface area of the bellows 150 as the bellows 150 unfolds, the folded insulation layer 300 also unfolds or unrolls in a similar manner. For example, as the first fixed end 310 of the folded insulation layer 300 moves in the downward direction with the tappet 110, the outer portion 340 of the folded insulation layer 300 gradually unfolds and leaves the space outside of the outer circumference of the bellows 150 to provide sufficient material to cover the entire surface area of the bellows 150 as the bellows 150 unfolds. Therefore, the folded insulation layer 300 protects the entire bellows 150 from heat when the tappet 110 is in the fully retracted position, the fully extended position, and any intermediate position.

Figure 5:
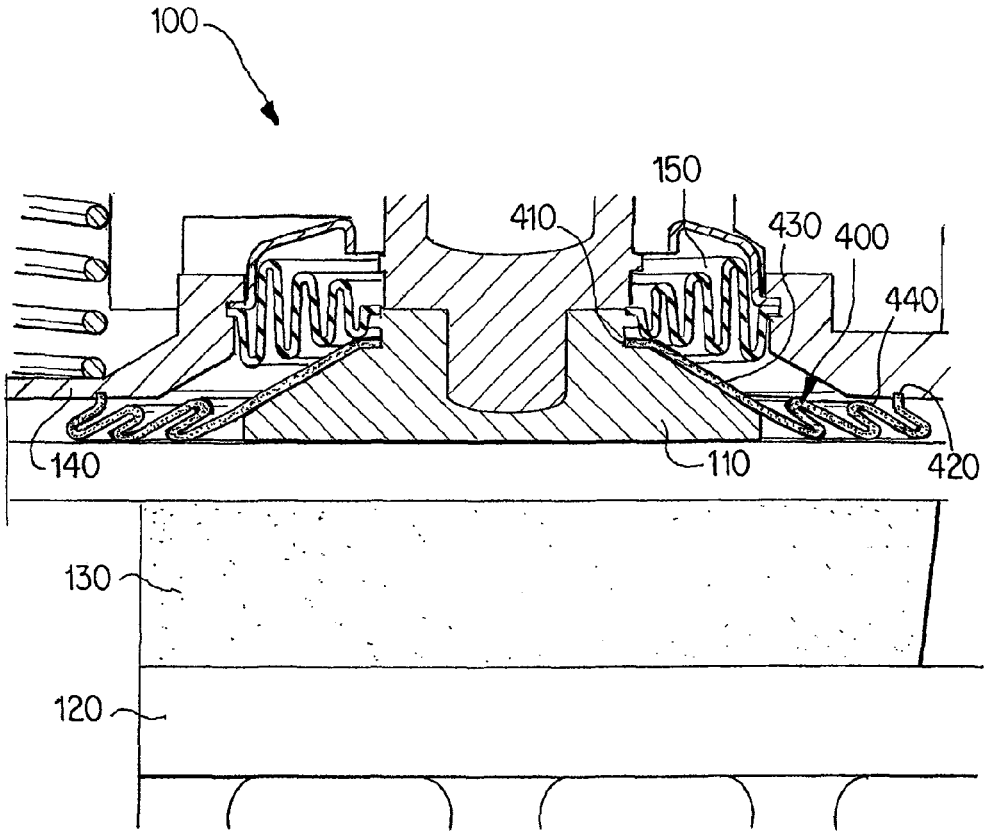
FIG. 5 shows a partial sectional view of a disc brake with an insulation shell between the tappet and the bellows, according to an exemplary embodiment of the present invention.

FIG. 5 shows a partial sectional view of a disc brake 100 with an insulation shell 400 between the tappet 110 and the bellows 150, according to another exemplary embodiment of the present invention. Similar to FIGS. 1 and 4, the tappet 110 shown in FIG. 5 is in a fully retracted position. The insulation shell 400 is a flexible thermal insulation material, which may be a woven or knitted material. For example, the flexible thermal insulation material may be made of silica yarns, a combination of silica and fiberglass yarns, or basalt yarns. Other materials may be chosen to optimize temperature resistance and disc brake design, and to minimize cost. The insulation shell 400 shown in FIG. 5 performs a similar function to the folded insulation layer 300 shown in FIG. 4.

As shown in FIG. 5, the insulation shell 400 has a first fixed end 410 and a second fixed end 420. The first fixed end 410 may be attached to the tappet 110 and the second fixed end 420 may be attached to the caliper 140. Alternatively, the first fixed end 410 may be attached to the inner circumference of the bellows 150. Some or all of the attachments may be made by clamping.

An inner portion 430 of the insulation shell 400 is adjacent to the first fixed end 410 of the insulation shell 400. The inner portion 430 of the insulation shell 400 is provided between the tappet 110 and the bellows 150 when the tappet 110 is in the fully retracted state. The inner portion 430 of the insulation shell 400 prevents the bellows 150 from contacting the tappet 110 when the tappet 110 is in the fully retracted state.

An outer portion 440 of the insulation shell 400 is adjacent to the second fixed end 420 of the insulation shell 400. As shown in FIG. 5, the outer portion 440 of the insulation shell 400 is folded within a space outside of an outer circumference of the bellows 150 when the tappet 110 is in the fully retracted state. The insulation shell 400 may be preformed so that the outer portion 440 collapses to fill the space outside of the outer circumference of the bellows 150 when the tappet 110 is in the fully retracted state. This facilitates retraction of the tappet 110 and maximizes the available space within the disc brake 100.

When the tappet 110 extends toward the brake disc 120, the bellows 150 expands to maintain the seal between the brake caliper 140 and the tappet 110. For example, the outer circumference of the bellows 150 is fixed to the brake caliper 140, and remains in place when the tappet 110 extends toward the brake disc 120. The inner circumference of the bellows 150 may be fixed to the tappet 110, and move toward the brake disc 120 with the tappet 110. Accordingly, the bellows 150 unfolds in a downward direction.

In order to protect the entire surface area of the bellows 150 as the bellows 150 unfolds, the insulation shell 400 also unfolds in a similar manner. For example, as the first fixed end 410 of the insulation shell 400 moves in the downward direction with the tappet 110, the outer portion 440 of the insulation shell 400 gradually unfolds and leaves the space outside of the outer circumference of the bellows 150 to provide sufficient material to cover the entire surface area of the bellows 150 as the bellows 150 unfolds. Therefore, the insulation shell 400 protects the entire bellows 150 from heat when the tappet 110 is in the fully retracted position, the fully extended position, and any intermediate position.

Figure 6:
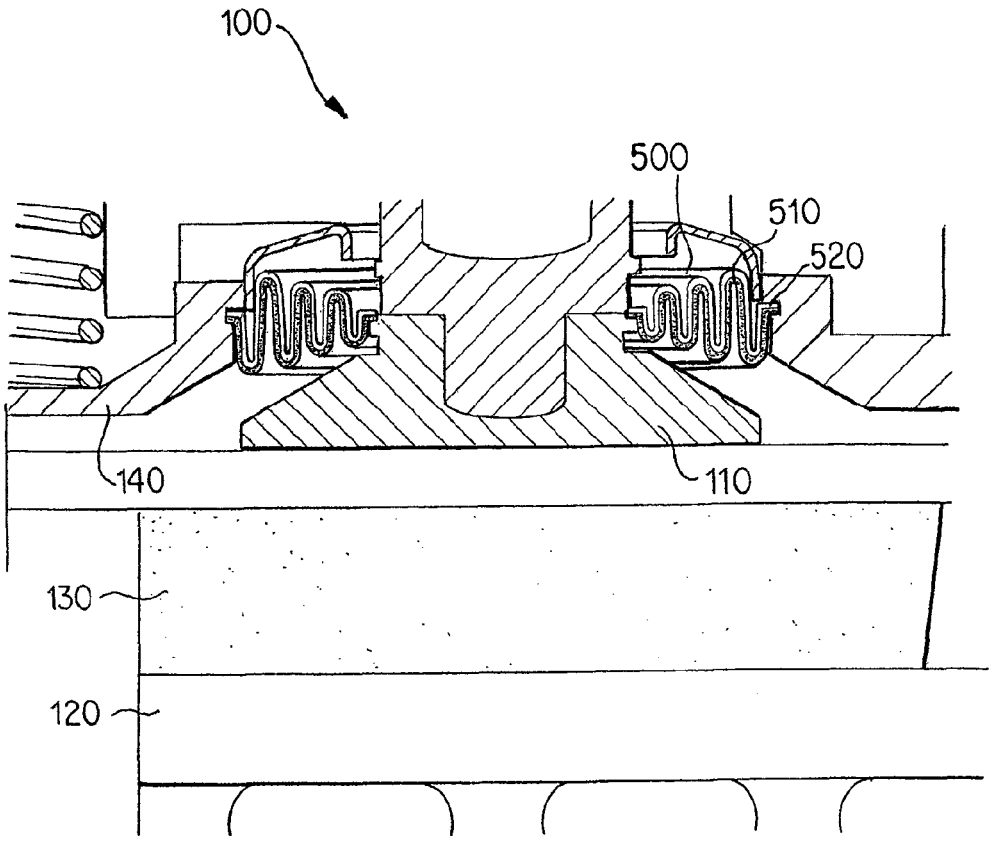
FIG. 6 shows a partial sectional view of a disc brake in which the bellows is replaced with a compound material including a layer of flexible thermal insulation material on which an elastomer layer is formed, according to an exemplary embodiment of the present invention.

FIG. 6 shows a partial sectional view of a disc brake 100 in which the bellows 500 is a compound material that includes a layer 520 of flexible thermal insulation material on which an elastomer layer 510 is formed, according to yet another exemplary embodiment of the present invention. Similar to FIG. 1, the tappet 110 shown in FIG. 6 is in a fully retracted position. The layer 520 of flexible thermal insulation material is a flexible thermal insulation material, which may be a woven or knitted material. For example, the flexible thermal insulation material may be made of silica yarns, a combination of silica and fiberglass yarns, or basalt yarns. Other materials may be chosen to optimize temperature resistance and disc brake design, and to minimize cost. The elastomer layer 510 may be made of silicon rubber.

In the present exemplary embodiment, the layer 520 of flexible thermal insulation material is integrated with the elastomer layer 510 to form the bellows 500. The layer 520 of flexible thermal insulation material serves as a carrier material for the elastomer layer 510. The elastomer layer 510 may be molded or sprayed on the layer 520 of flexible thermal insulation material. The elastomer layer 510 provides a seal against dust, chemicals, gases, and water, while the layer 520 of flexible thermal insulation material provides a thermal barrier.

Figure 2:
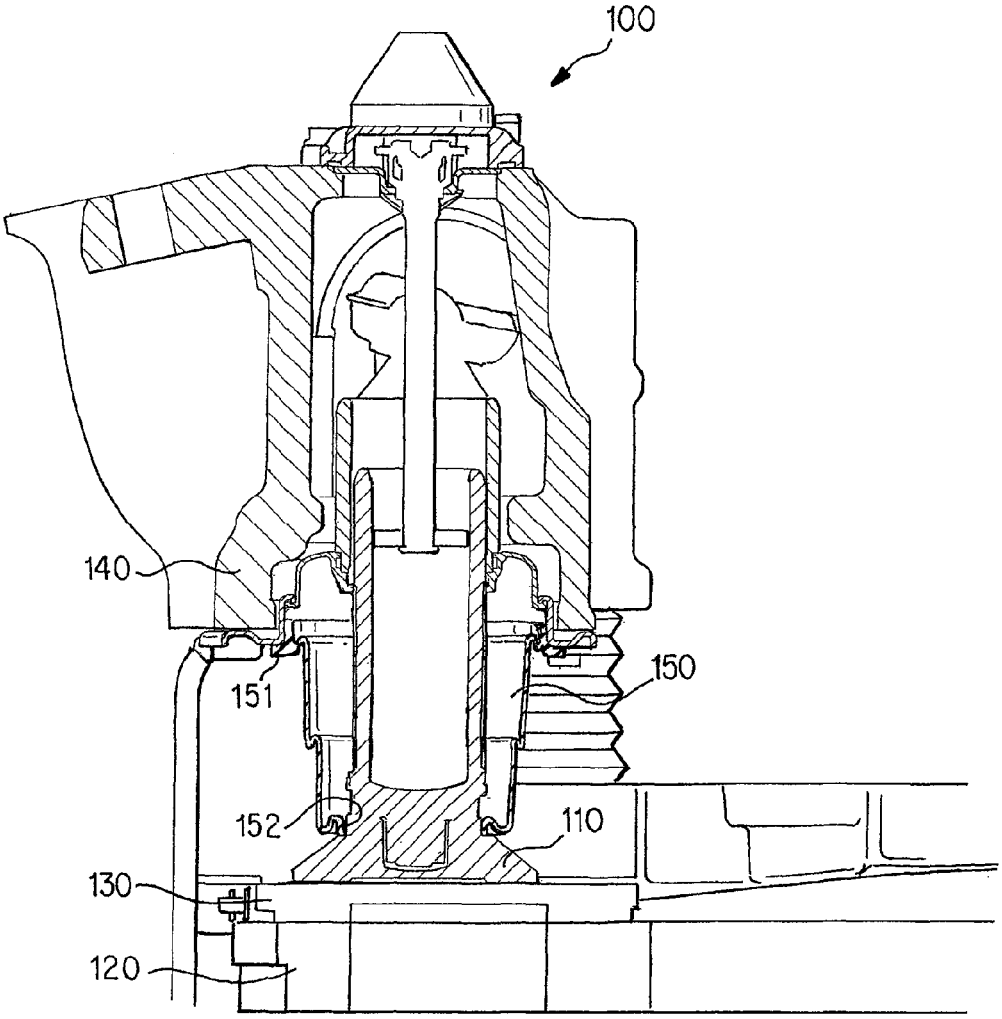
FIG. 2 RELATED ART
FIG. 2 shows a partial sectional view of the typical disc brake of FIG. 1 when the brake pad and the brake disc are in a maximum wear condition.

As shown in FIG. 6, the layer 520 of flexible thermal insulation material faces the tappet 110 and the brake pad 130, while the elastomer layer 510 faces the internal caliper components. Like the bellows 150 shown in FIG. 2, when the tappet 110 extends toward the brake disc 120, the bellows 500 expands to maintain the seal between the brake caliper 140 and the tappet 110. For example, the outer circumference of the bellows 500 is fixed to the brake caliper 140, and remains in place when the tappet 110 extends toward the brake disc 120. The inner circumference of the bellows 500 may be fixed to the tappet 110, and move toward the brake disc 120 with the tappet 110. Accordingly, the bellows 500 shown in FIG. 6 unfolds in a downward direction, similar to the bellows 150 shown in FIG. 2.

Because the bellows 500 includes the layer 520 of flexible thermal insulation material, the elastomer layer 510 is protected from heat as the tappet 110 extends and the bellows 500 unfolds. This is because the layer 520 of flexible thermal insulation material is always positioned between the elastomer layer 510 of the bellows 500 and the tappet 110. Therefore, the layer 520 of flexible thermal insulation material protects the entire elastomer layer 510 of the bellows 500 from heat when the tappet 110 is in the fully retracted position, the fully extended position, and any intermediate position.

The bellows 500 made of the compound material can be used to replace any bellows or deformable sealing element within the disc brake 100. For example, the bellows 500 made of the compound material could replace the guide pin bellows (not shown). The bellows 500 would be oriented such that the layer 520 of flexible thermal insulation material faces a heat source of the disc brake 100.

Figure 7A:
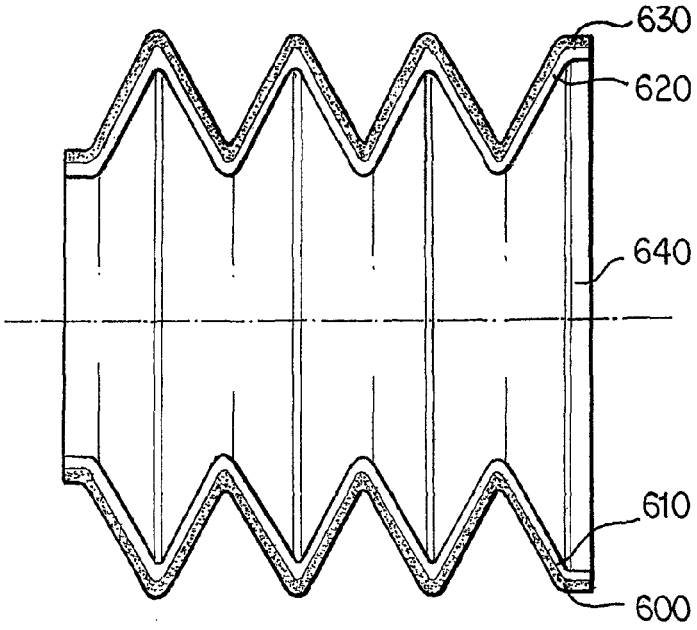
FIGS. 7A and 7B show examples of bellows made with the compound material according to exemplary embodiments of the present invention.
Figure 7B:
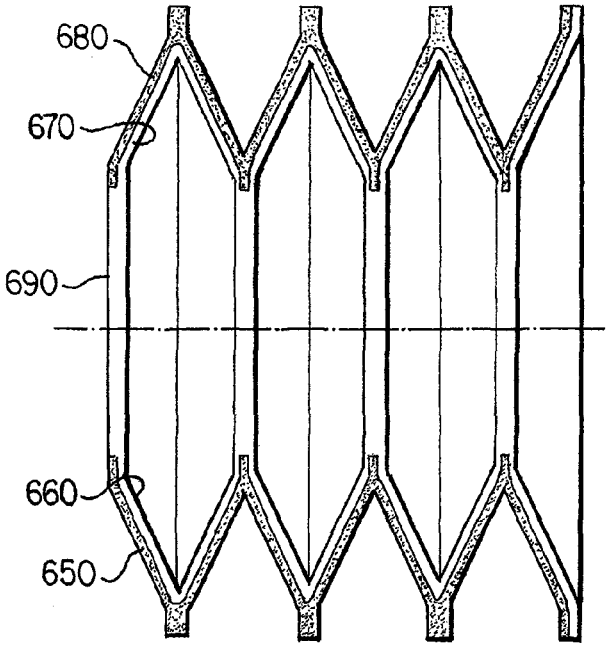
Figure 8A:
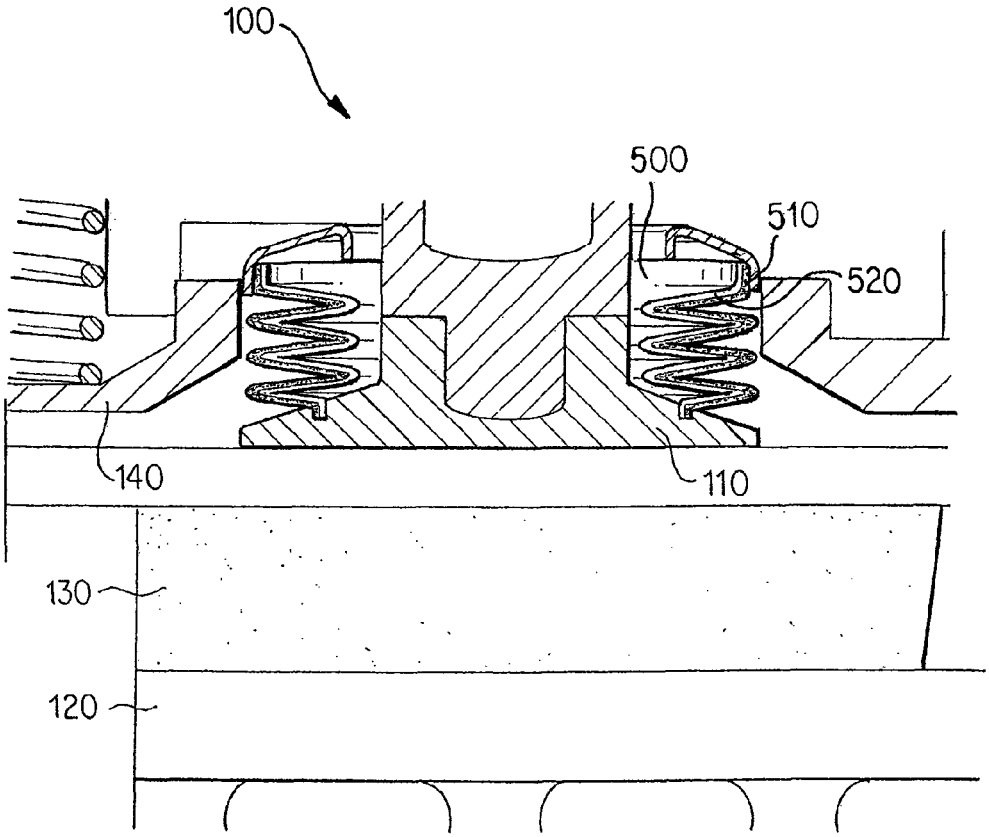
FIGS. 8A and 8B show examples of disc brakes that incorporate the bellows shown in FIGS. 7A and 7b, respectively.

FIGS. 7A and 7B show examples of other configurations of bellows made with the compound material according to exemplary embodiments of the present invention. For example, as shown in FIG. 7A, the bellows can include a first layer 600 of flexible thermal insulation material upon which a first elastomer layer 610 is formed, along with a second layer 630 of flexible thermal insulation material upon which a second elastomer layer 620 is formed. The first elastomer layer 610 and the second elastomer layer 620 face each other and are separated by an air gap 640. FIG. 8A shows an exemplary embodiment of a disc brake that incorporates the bellows shown in FIG. 7A.

Figure 8B:
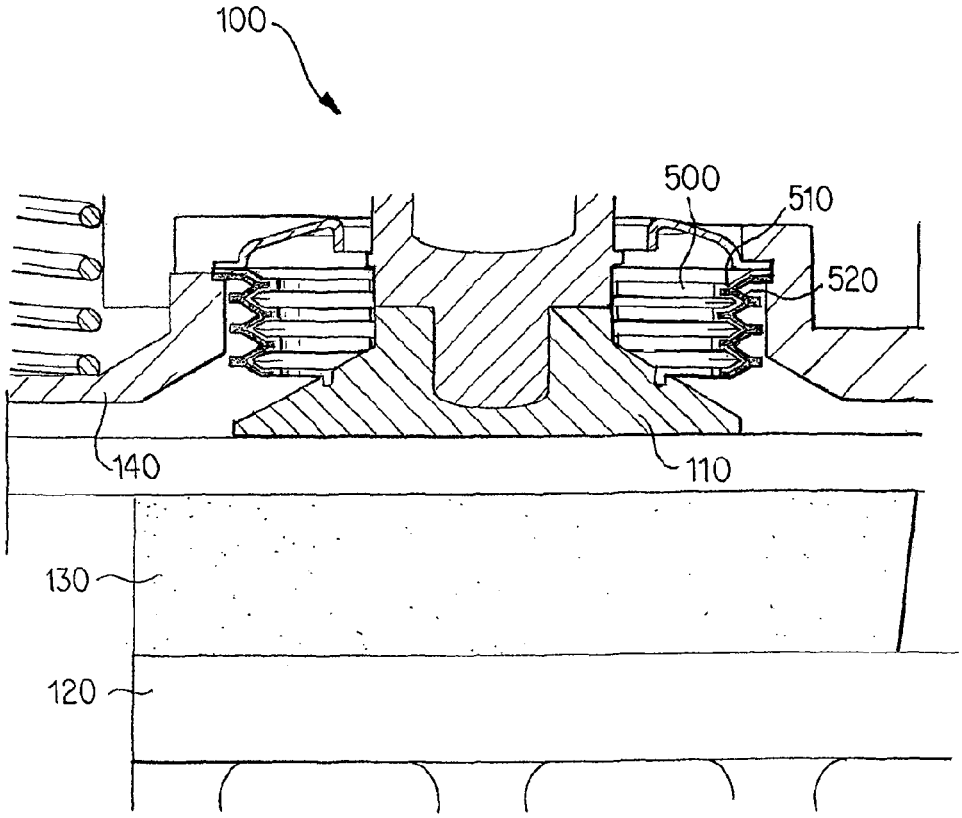

Similarly, as shown in FIG. 7B, the bellows can include a first layer 650 of flexible thermal insulation material upon which a first elastomer layer 660 is formed, along with a second layer 680 of flexible thermal insulation material upon which a second elastomer layer 670 is formed. The first elastomer layer 660 and the second elastomer layer 670 may be joined by a plurality of additional elastomer layers 690 to form a series of stacked discs. Each of the stacked discs shown in FIG. 7B has a hollow core. FIG. 8B shows an exemplary embodiment of a disc brake that incorporates the bellows shown in FIG. 7B.

Exemplary embodiments of the present invention use a flexible thermal insulation material to protect the bellows of a disc brake from heat generated during the braking process. The insulation material may be an insulation disc that is inserted into an existing air gap between the tappet and the bellows. In another exemplary embodiment, the insulation material may be a folded or rolled insulation layer or shell that unfolds or unrolls as the tappet extends toward the brake pad. Alternatively, the bellows may be replaced by a compound material that includes the insulation material as a carrier for an elastomer layer.

The flexible thermal insulation material may be a woven or knitted material, which advantageously provides an adaptive and flexible shape. The flexible thermal insulation material may be made of silica yarns, a combination of silica and fiberglass yarns, or basalt yarns, each of which provides very good protection against conductive, convective, and radiative heat transfer. Using the flexible thermal insulation material to insulate the rubber bellows can significantly extend the lifetime of the bellows and prevent a failure of the bellows.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A disc brake for a motor vehicle, the disc brake comprising:

a brake disc;

a brake caliper configured to straddle the brake disc;

a tappet carried by the brake caliper and arranged to push a brake pad against the brake disc; [and]

*an air gap located between the tappet and the caliper, the air gap varying in size as the tappet extends from a fully retracted position away from the brake disc to a fully extended position closer to the brake disc; and* a bellows [provided] *extending across the air gap* between the brake caliper and the tappet to seal [a] *the air* gap between the brake caliper and the tappet, wherein the bellows comprises:

a first layer of *non-metallic* flexible thermal insulation material; and a first elastomer layer formed on a first surface of the first layer of *non-metallic* flexible thermal insulation material such that a first surface of the first elastomer layer contacts the first surface of the first layer of *non-metallic* flexible thermal insulation material, wherein a second surface of the first layer of *non-metallic* flexible thermal insulation material opposing the first surface *is exposed to and* faces the brake pad, and wherein a second surface of the first elastomer layer *is exposed to and* faces [an] *the* air gap *on a side of the first elastomer layer facing away from the brake disc*.

2. The disc brake according to claim 1, wherein the flexible thermal insulation material is a woven or knitted material.

3. The disc brake according to claim 2, wherein the woven or knitted material comprises silica yarns, a combination of silica and fiberglass yarns, or basalt yarns.

4. The disc brake according to claim 1, wherein the elastomer layer comprises silicon rubber.

[5. The disc brake according to claim 1, wherein the bellows further comprises:

a second layer of flexible thermal insulation material; and a second elastomer layer formed on a first surface of the second layer of flexible thermal insulation material, wherein the first elastomer layer and the second elastomer layer are separated by the air gap.]

[6. The disc brake according to claim 1, wherein the bellows further comprises:

a second layer of flexible thermal insulation material; and a second elastomer layer formed on a first surface of the second layer of flexible thermal insulation material, wherein the first elastomer layer and the second elastomer layer are joined by a plurality of additional elastomer layers to form a series of stacked discs.]

7. A bellows for protecting internal components of a disc brake for a motor vehicle, the bellows comprising:

a first layer of *non-metallic* flexible thermal insulation material; and a first elastomer layer formed on a first surface of the first layer of *non-metallic* flexible thermal insulation material such that a first surface of the first elastomer layer contacts the first surface of the first layer of *non-metallic* flexible thermal insulation material, wherein a second surface of the first layer of *non-metallic* flexible thermal insulation material opposing the first surface *is exposed to and* faces a heat source of the disc brake, and wherein a second surface of the first elastomer layer faces an air gap *on a side of the first elastomer layer facing away from the brake disc*.

8. The bellows according to claim 7, wherein the flexible thermal insulation material is a woven or knitted material.

9. The bellows according to claim 8, wherein the woven or knitted material comprises silica yarns, a combination of silica and fiberglass yarns, or basalt yarns.

10. The bellows according to claim 7, wherein the elastomer layer comprises silicon rubber.

[11. The bellows according to claim 7, further comprising:

a second layer of flexible thermal insulation material; and a second elastomer layer formed on a first surface of the second layer of flexible thermal insulation material, wherein the first elastomer layer and the second elastomer layer are separated by the air gap.]

[12. The bellows according to claim 7, further comprising:

a second layer of flexible thermal insulation material; and a second elastomer layer formed on a first surface of the second layer of flexible thermal insulation material, wherein the first elastomer layer and the second elastomer layer are joined by a plurality of additional elastomer layers to form a series of stacked discs.]

13. An axle for a motor vehicle, the axle comprising a disc brake, wherein the disc brake comprises:

a brake disc;

a brake caliper configured to straddle the brake disc;

a tappet carried by the brake caliper and arranged to push a brake pad against the brake disc; [and]

*an air gap located between the tappet and the caliper, the air gap varying in size as the tappet extends from a fully retracted position away from the brake disc to a fully extended position closer to the brake disc; and* a bellows [provided] *extending across the air gap* between the brake caliper and the tappet to seal [a] *the air* gap between the brake caliper and the tappet, wherein the bellows comprises:

a first layer of *non-metallic* flexible thermal insulation material; and a first elastomer layer formed on a first surface of the first layer of *non-metallic* flexible thermal insulation material such that a first surface of the first elastomer layer contacts the first surface of the first layer of *non-metallic* flexible thermal insulation material, wherein a second surface of the first layer of *non-metallic* flexible thermal insulation material opposing the first surface *is exposed to and* faces the brake pad, and wherein a second surface of the first elastomer layer *is exposed to and* faces [an] *the* air gap *on a side of the first elastomer layer facing away from the brake disc*.

*14. A disc brake for a motor vehicle, the disc brake comprising:*

*a brake disc;*

*a brake caliper configured to straddle the brake disc;*

*a tappet carried by the brake caliper and arranged to push a brake pad against the brake disc;*

*an air gap located between the tappet and the caliper, the air gap varying in size as the tappet extends from a fully retracted position away from the brake disc to a fully extended position closer to the brake disc;*

*a layer of non-metallic flexible thermal insulation material extending across the air gap between the tappet and the caliper; and*

*an elastomer layer configured to seal the air gap when the tappet is in the fully retracted position, the fully extended position, and any intermediate position, the elastomer layer being formed such that a first surface of the elastomer layer contacts at least a portion of a first surface of the layer of non-metallic flexible thermal insulation material in the fully retracted position,*

*wherein a second surface of the layer of non-metallic flexible thermal insulation material opposing the first surface is exposed to and faces the brake pad,*

*wherein a second surface of the elastomer layer is exposed to the air gap on a side of the elastomer layer facing away from the brake disc, and*

*wherein the layer of non-metallic flexible thermal insulation material is arranged to shield the entire first surface of the elastomer layer from heat when the tappet is in the fully retracted position, the fully extended position, and any intermediate position.*

*15. The disc brake according to claim 14, wherein the flexible thermal insulation material is a woven or knitted material.*

*16. The disc brake according to claim 15, wherein the woven or knitted material comprises silica yarns, a combination of silica and fiberglass yarns, or basalt yarns.*

*17. The disc brake according to claim 14, wherein the elastomer layer comprises silicon rubber.*

*18. An axle for a motor vehicle, the axle comprising a disc brake, wherein the disc brake comprises:*

*a brake disc;*

*a brake caliper configured to straddle the brake disc;*

*a tappet carried by the brake caliper and arranged to push a brake pad against the brake disc;*

*an air gap located between the tappet and the caliper, the air gap varying in size as the tappet extends from a fully retracted position away from the brake disc to a fully extended position closer to the brake disc;*

*a layer of non-metallic flexible thermal insulation material extending across the air gap between the tappet and the caliper;*

*an elastomer layer configured to seal the air gap when the tappet is in the fully retracted position, the fully extended position, and any intermediate position, the elastomer layer being formed such that a first surface of the elastomer layer contacts at least a portion of a first surface of the layer of non-metallic flexible thermal insulation material in the fully retracted position,*

*wherein a second surface of the layer of non-metallic flexible thermal insulation material opposing the first surface is exposed to and faces the brake pad,*

*wherein a second surface of the elastomer layer is exposed to the air gap on a side of the elastomer layer facing away from the brake disc, and*

*wherein the layer of non-metallic flexible thermal insulation material is arranged to shield the entire first surface of the elastomer layer from heat when the tappet is in the fully retracted position, the fully extended position, and any intermediate position.*

*19. The axle according to claim 18, wherein the elastomer layer is formed so as to be folded within the air gap in the fully retracted position and unfolded as the tappet moves toward the fully extended position.*

*20. The axle according to claim 19, wherein the layer of non-metallic flexible thermal insulation material is arranged to prevent contact between the elastomer layer and the tappet when the tappet is in the fully retracted position, the fully extended position, and any intermediate position.*

*21. The disc brake according to claim 14, wherein the elastomer layer is formed so as to be folded within the air gap in the fully retracted position and unfolded as the tappet moves toward the fully extended position.*

*22. The disc brake according to claim 21, wherein the layer of non-metallic flexible thermal insulation material is arranged to prevent contact between the elastomer layer and the tappet when the tappet is in the fully retracted position, the fully extended position, and any intermediate position.*

*23. The bellows according to claim 7, wherein the first layer of non-metallic flexible thermal insulation material serves as a carrier material for the first elastomer layer.*

* * * * *